United States Patent
Okuda et al.

(10) Patent No.: US 7,675,763 B2
(45) Date of Patent: Mar. 9, 2010

(54) SEMICONDUCTOR POWER CONVERTER APPARATUS

(75) Inventors: Tatsuya Okuda, Tokyo (JP); Takuya Michinaka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/633,467

(22) Filed: Dec. 5, 2006

(65) Prior Publication Data
US 2007/0284664 A1 Dec. 13, 2007

(30) Foreign Application Priority Data
Jun. 8, 2006 (JP) ............... 2006-159665

(51) Int. Cl.
*H02M 5/42* (2006.01)
*H02M 7/04* (2006.01)
*H02M 7/68* (2006.01)

(52) U.S. Cl. ............... 363/89; 363/50; 363/59; 363/60; 361/91.5; 323/276; 323/277

(58) Field of Classification Search ........... 363/50, 363/59, 60, 89; 361/91.5; 323/276, 277
See application file for complete search history.

(56) References Cited

U.S. PATENT DOCUMENTS

| | | | | |
|---|---|---|---|---|
| 5,187,653 | A | * | 2/1993 | Lorenz ............ 363/89 |
| 5,986,902 | A | * | 11/1999 | Brkovic et al. ........ 363/50 |
| 6,215,634 | B1 | | 4/2001 | Terasawa |
| 6,268,990 | B1 | * | 7/2001 | Ogura et al. ........ 361/91.7 |
| 6,952,355 | B2 | * | 10/2005 | Riggio et al. ........ 363/21.15 |
| 6,972,972 | B2 | * | 12/2005 | Duncan et al. ........ 363/56.01 |
| 2002/0195286 | A1 | | 12/2002 | Shirakawa et al. |
| 2004/0024937 | A1 | * | 2/2004 | Duncan et al. ........ 710/100 |

FOREIGN PATENT DOCUMENTS

| | | |
|---|---|---|
| JP | 10-38964 A | 2/1998 |
| JP | 2000-209776 | 7/2000 |
| JP | 11-299221 | 4/2001 |
| JP | 2002-222920 | 8/2002 |
| JP | 2003-009546 | 12/2002 |
| JP | 2004-80865 A | 3/2004 |

* cited by examiner

*Primary Examiner*—Zandra Smith
*Assistant Examiner*—Telly D Green
(74) *Attorney, Agent, or Firm*—Sughrue Mion, PLLC

(57) ABSTRACT

Even when one of IGBTs fails in a semiconductor power converter apparatus in which a plurality of semiconductor elements are connected in parallel, the remaining IGBT(s) is prevented from failing with a simple circuit configuration. The semiconductor power converter apparatus includes: a semiconductor power conversion circuit in which a first IGBT having a temperature sensing unit and a second IGBT having a current sensing unit are connected in parallel, for causing the first and second semiconductor elements to perform switching operations; an overheat protection circuit for performing overheat protection for the first and second IGBTs based on temperature information obtained from the temperature sensing unit of the first IGBT; and an overcurrent protection circuit for performing overcurrent protection for the first and second IGBTs based on current information obtained from the current sensing unit of the second IGBT.

5 Claims, 7 Drawing Sheets

SEMICONDUCTOR POWER CONVERTER APPARATUS

BACKGROUND OF THE INVENTION

1. Field of the Invention

This invention relates to a semiconductor power converter apparatus in which a plurality of semiconductor elements are connected in parallel.

2. Description of Related Art

In a semiconductor power converter apparatus using power semiconductor elements, such as represented by IGBTs (Insulated Gate Bipolar Transistors), the IGBTs are caused to perform switching operations and the proportions of the current passing therethrough are controlled, to adjust the electric power flow. Passage of an overcurrent through such a semiconductor power converter apparatus elevates the temperature of the IGBTs, which may result in destruction of the semiconductor power converter apparatus. A variety of protection circuits for preventing the IGBTs from the destruction have been proposed which detects the temperature of the IGBTs with a temperature sensing unit to stop the operation of the IGBTs or to limit the passing current through the IGBTs before the IGBTs result in destruction.

For example, JP-B-3194353 describes a method for protecting IGBTs against overheating in the case where two chips of IGBTs are provided in parallel, each of the IGBTs having a diode for detecting temperatures thereon. The diodes are connected in parallel, and the forward voltage of the diodes is monitored while passing a constant current through the diodes from a single current source. Here, because the forward voltage of diodes shows such a profile that it decreases linearly with respect to the temperature, the temperature detection device is able to find that the detected temperature has reached a desired temperature through monitoring the forward voltage.

In addition, according to JP-A-2004-80865, a plurality of temperature sensing diodes connected in series are categorized into at least two separate groups, and a current is supplied from a constant current circuit to the temperature sensing diodes connected in series. A difference in the series voltage drop between the respective groups is obtained with a differential circuit. If the difference voltage exceeds a predetermined voltage, it is determined that one of the IGBTs is in an abnormal condition, so a signal indicating that is issued. Thereby, even when a temperature rise occurs in one among the plurality of the semiconductor elements, the temperature of the semiconductor elements can be detected accurately.

In the conventional example disclosed in JP-B-3194353, a problem has been that, since a plurality of temperature sensing diodes are connected in parallel, a variation in the characteristics of the temperature sensing diodes causes an imbalance in the currents flowing through the temperature sensing diodes, degrading the accuracy of the IGBTs' temperatures detected. Another problem has been as follows. In the case where all the IGBTs operate properly, an accurate temperature can be detected to some extent. However, in the case where any one of the IGBTs undergoes an open destruction, the temperature of the IGBT that has undergone the open destruction becomes extremely lower than those of the other IGBTs and accordingly, the detected value of the temperature of the IGBTs becomes lower than the actual temperature. This may lead to destruction of the other IGBTs, like a chain reaction. Moreover, although only one current source is necessary, all the temperature sensing diodes require passage of current therethrough. This complicates the wiring structure, leading to the problems of cost increases and degradation in noise resistance performance.

In addition, the conventional example disclosed in JP-A-2004-80865 performs abnormality determination for IGBTs by making use of the fact that a temperature difference occurs between a normal IGBT and an abnormal IGBT and a forward voltage difference arises between the temperature sensing diodes in each group. Nevertheless, since the temperature sensing diodes in each group are connected in series, a difference arises between the forward voltages of the temperature sensing diodes in each group even when they are at the same temperature, because of variations in the characteristics of the temperature sensing diodes. Therefore, the threshold voltage for determining an abnormality in the IGBTs cannot be set to a very low voltage. For this reason, it is necessary to cause a temperature difference between a normal IGBT and an abnormal IGBT to perform the abnormality determination for IGBTs, and this temperature difference may cause the IGBTs to undergo thermal destruction. Moreover, this conventional example requires two current sources, and furthermore, all the temperature sensing diodes require passage of current therethrough. This complicates the wiring structure, leading to the problems of cost increases and degradation in noise resistance performance.

SUMMARY OF THE INVENTION

This invention has been accomplished to resolve the foregoing problems, and it is an object of the invention to prevent the remaining semiconductor element(s) from failure with a simple circuit configuration, even when any one of the semiconductor elements fails in a semiconductor power converter apparatus wherein a plurality of semiconductor elements are connected in parallel.

This invention provides a semiconductor power converter apparatus comprising: a semiconductor power conversion circuit in which a first semiconductor element having a temperature sensing unit and a second semiconductor element having a current sensing unit are connected in parallel, for causing the first and second semiconductor elements to perform switching operations; an overheat protection circuit for performing overheating protection for the first and second semiconductor elements based on temperature information obtained from the temperature sensing unit of the first semiconductor element; and an overcurrent protection circuit for performing overcurrent protection for the first and second semiconductor elements based on current information obtained from the current sensing unit of the second semiconductor element.

According to the invention, even when one of the semiconductor elements fails in a semiconductor power converter apparatus in which a plurality of semiconductor elements are connected in parallel, the other semiconductor elements can be prevented from destruction, and a highly reliable semiconductor power converter apparatus can be obtained.

DESCRIPTION OF THE PREFERRED EMBODIMENTS

Embodiment 1

Figure 1:
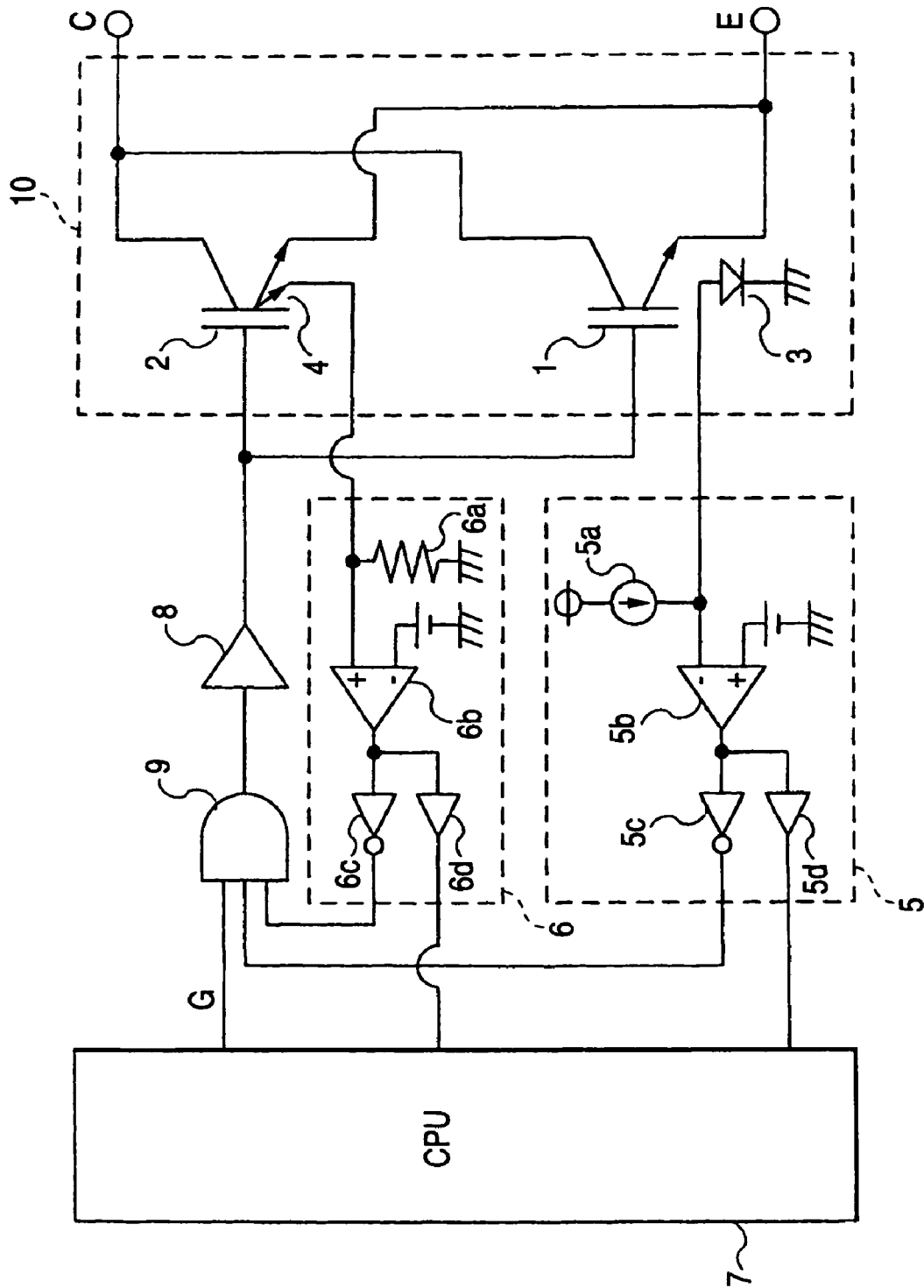
FIG. 1 is a circuit diagram showing a semiconductor power converter apparatus according to Embodiment 1 of the invention.

FIG. 1 is a circuit diagram of a semiconductor power converter apparatus according to Embodiment 1 of the invention. Here, an IGBT module in which two IGBTs are connected in parallel is shown as a semiconductor power conversion circuit 10, which is provided with a collector terminal C, an emitter terminal E, and a gate signal terminal G as its external terminals. An IGBT 1 has a temperature sensing diode 3 for detecting the temperature of the IGBT 1, and an IGBT 2 has a current sensing cell 4 for detecting the current of the IGBT 2. These IGBTs 1 and 2 are mounted on a same heatsink (not shown).

An overheat protection circuit 5 includes a constant current source 5a for causing the temperature sensing diode 3 to generate a forward voltage, an overheat determining comparator circuit 5b for comparing the forward voltage of the temperature sensing diode 3 with a predetermined reference voltage value, a logic inverter circuit 5c for turning off the IGBT 1 and the IGBT 2 if the IGBT 1 is determined to be in an overheated condition, and a buffer 5d for reporting the overheated condition to an upper level CPU 7.

An overcurrent protection circuit 6 includes a sensing resistor 6a for converting the current value flowing through the current sensing cell 4 into a voltage value, an overcurrent determining comparator circuit 6b for comparing the voltage value generated by the sensing resistor 6a with a predetermined reference voltage value, a logic inverter circuit 6c for turning off the IGBT 1 and the IGBT 2 if the IGBT 2 is determined to be in an overcurrent condition, and a buffer 6d for reporting the overcurrent condition to the upper level CPU 7.

The IGBT 1 and the IGBT 2 connected in parallel are driven by a common gate signal G through a buffer circuit 8, but if the overheat protection circuit 5 or the overcurrent protection circuit 6 has been operated, the IGBT 1 and the IGBT 2 are turned off by an AND circuit 9.

Next, basic operations of the overheat protection and the overcurrent protection are discussed.

The temperature sensing diode 3 has a negative temperature dependency; that is, as the temperature becomes higher, its forward voltage becomes lower. The temperature sensing diode 3 can detect the temperature of the IGBT 1 by making use of this property. The overheat determining comparator circuit 5b compares the temperature of the IGBT 1 with a predetermined reference temperature, and if the IGBT 1 is in an overheated condition, it turns off the IGBT 1 and the IGBT 2 through the logic inverter circuit 5c and the AND circuit 9, and at the same time, it reports to the upper level CPU 7 that the IGBT 1 is in an overheated condition. Since the temperature sensing diode 3 and the overheat determining comparator circuit 5b correspond to each other one to one, the overheat determining comparator circuit 5b can be adjusted to such a condition that the variation in the characteristics of the temperature sensing diode 3 is taken into consideration, so that the overheat determination temperature can be made more accurate. Because a current that is proportional to the current flowing through the IGBT 2 (usually one several thousandths to one several ten-thousandths) flows through the current sensing cell 4, the current flowing through the IGBT 2 can be detected by monitoring the voltage of the sensing resistor 6a.

The overcurrent determining comparator circuit 6b compares the current flowing through the IGBT 2 with a predetermined reference current value, and if it is determined that the IGBT 2 is in an overcurrent condition, the overcurrent determining comparator circuit 6b causes the IGBT 1 and the IGBT 2 to be turned off through the logic inverter circuit 6c and the AND circuit 9 and reports to the upper level CPU 7 that the IGBT 2 is in an overcurrent condition.

Thus, providing the overheat protection circuit 5 and the overcurrent protection circuit 6 can prevent the IGBTs from the overheat destruction and the overcurrent destruction and makes it possible to realize a highly reliable semiconductor power converter apparatus.

Next, an operation in the case where either one of the IGBTs has failed will be discussed.

When the IGBT 1 undergoes an open failure, the current value flowing through the IGBT 2 becomes two times greater, and accordingly, the temperature increase of the IGBT 2 becomes about two times greater. Consequently, it is feared that the IGBT 2, which is not provided with the temperature sensing diode 3, also undergoes a thermal destruction and ceases the function of the power converter circuit. Nevertheless, in this embodiment, the IGBT 2 is provided with the current sensing cell, so it is possible to prevent the overheat destruction of the IGBT 2 by turning off the IGBT 2 with the overcurrent protection circuit 6 before such an overcurrent as to cause the thermal destruction of the IGBT 2 flows therethrough.

Figure 2:
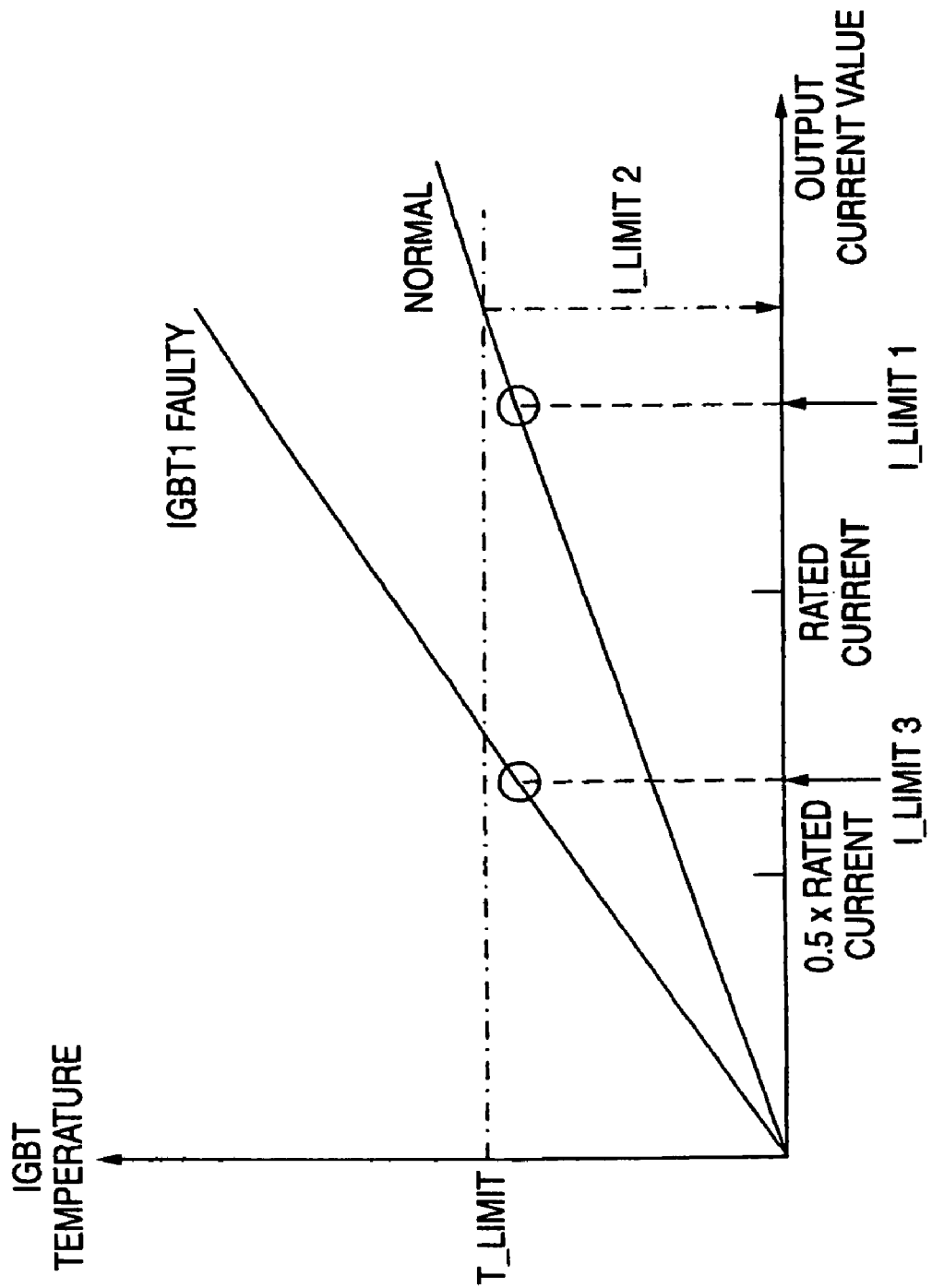
FIG. 2 is a graph for illustrating a protection operation of Embodiment 1.

Especially, it is possible to prevent the overheat destruction of the IGBT 2 more reliably when the threshold value of the current at which the overcurrent protection circuit 6 operates is set to be equal to or lower than the current value at which the overheat protection circuit 5 operates. This will be explained with reference to FIG. 2.

I_limit1 denotes the overcurrent protection operation level during a normal operation, I_limit2 denotes the level of the current value at which the overheat protection operates in the normal condition, and I_limit3 denotes the overcurrent protection level when the IGBT 1 has undergone an open failure. In the present embodiment, I_limit1 is set to be equal to or lower than I_limit2. When the IGBT 1 undergoes an open failure, the current value flowing through the IGBT 2 and the current value flowing through the current sensing cell become two times greater. Therefore, the overcurrent protection operation level I_limit3 results in about one half of that in the normal condition. This makes it possible to effect the overcurrent protection of the IGBT 2 reliably before the IGBT 2 reaches the overheat protection operation level T_limit as the output current increases.

As a result, a normal operation using the IGBT 2 only is performed when the output current is equal to or lower than I_limit3, while an overcurrent protection for the IGBT 2 operates when the output current is higher than I_limit3. The overheat destruction prevention for the IGBT 2 is possible in this way, and it becomes possible to realize a semiconductor power converter apparatus with high reliability and high redundancy.

Thus, according to Embodiment 1, the semiconductor power converter apparatus comprises the semiconductor power conversion circuit 10 in which the first IGBT 1 having the temperature sensing unit 3 and the second IGBT 2 having the current sensing unit 4 are connected in parallel, for causing the first and second semiconductor elements 1 and 2 to perform switching operations, the overheat protection circuit 5 for performing the overheat protection for the first and second IGBTs 1 and 2 based on temperature information obtained from the temperature sensing unit 3 of the first IGBT 1, and the overcurrent protection circuit 6 for performing the overcurrent protection for the first and second IGBTs 1 and 2 based on current information obtained from the current sensing unit 4 of the second IGBT 2. Thus, even when one of the IGBTs fails, it is possible to prevent the other of the IGBTs from destruction, and consequently, it is possible to realize a highly reliable semiconductor power converter apparatus.

In addition, even when one of the IGBTs fails, the other of the IGBTs can be prevented from overheat destruction reliably by setting the current threshold value at which the overcurrent protection circuit 6 operates to be equal to or lower than the current value at which the overheat protection circuit 5 operates, which makes it possible to realize a more reliable semiconductor power converter apparatus.

It should be noted that although the current sensing cell 4 is not provided for the IGBT 1 and the temperature sensing diode 3 is not provided for the IGBT 2, the same effect can of course be attained by providing the temperature sensing diode 3 and the current sensing cell 4 for both of the IGBT 1 and the IGBT 2 and masking either one of the functions thereof.

Embodiment 2

Figure 3:
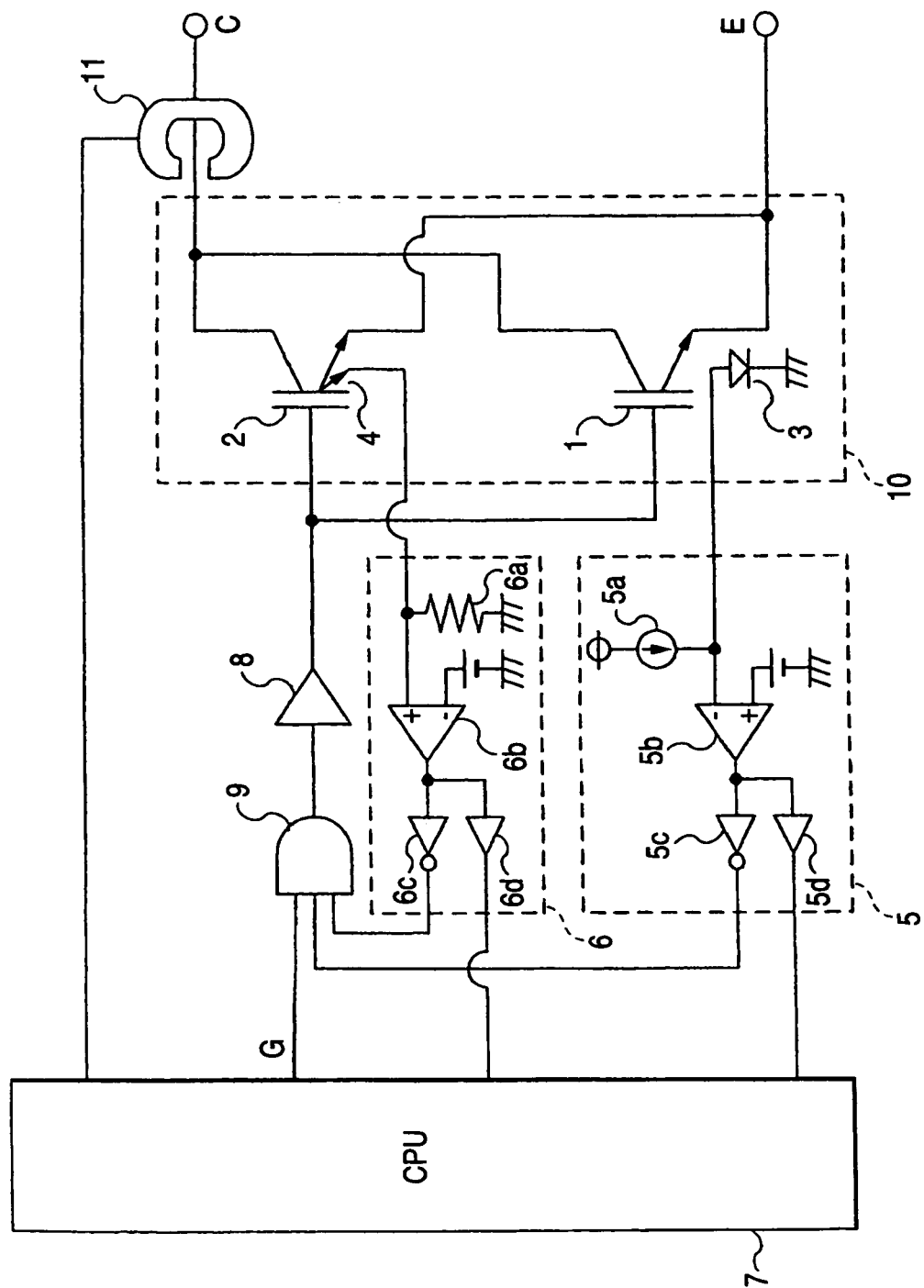
FIG. 3 is a circuit diagram of a semiconductor power converter apparatus according to Embodiment 2.

FIG. 3 is a circuit diagram of a semiconductor power converter apparatus according to Embodiment 2 of the invention, which attains a semiconductor power converter apparatus with higher reliability and higher redundancy by detecting the output current of the semiconductor power conversion circuit 10.

Referring to FIG. 3, a current sensor 11 detects the output current of the semiconductor power conversion circuit 10, which is the total current of the IGBT 1 and the IGBT 2. The output of the current sensor 11 is input into a CPU 7. When the overcurrent protection circuit 5 or the overheat protection circuit 6 operates, the CPU 7 compares the detected value by the current sensor 11 with a predetermined set value during the protection operation.

At this time, if both the IGBTs are in a normal condition, the output value from the current sensor shows a greater value than I_limit1, while if either of the IGBTs undergoes an open failure, the output value shows a value about equal to I_limit3. Therefore, it can be determined that both the IGBT 1 and the IGBT 2 are in a normal condition when the output of the current sensor is greater than the set value during the protection operation, while either one of the IGBTs is faulty when the output of the current sensor is less than the set value.

If it is determined that either one of the IGBTs is faulty, the output current of the semiconductor power conversion circuit 10 is controlled to be equal to or less than one half by the current limiting function of the CPU 7 to prevent the other one of the IGBT from being destructed. Thus, it becomes possible to realize a semiconductor power converter apparatus with high reliability and high redundancy.

If the IGBT 2 undergoes an open failure, the current value flowing through the IGBT 1 becomes two times greater, and accordingly the increase of the temperature of the IGBT 1 becomes two times greater; however, because the temperature detection is performed for the IGBT 1 by the temperature sensing diode 4, the overheat destruction of the IGBT 1 can be prevented.

Here, the current limiting function of the CPU 7 in the case where an IGBT fails will be explained with reference to FIGS. 4 and 5.

Figure 4:
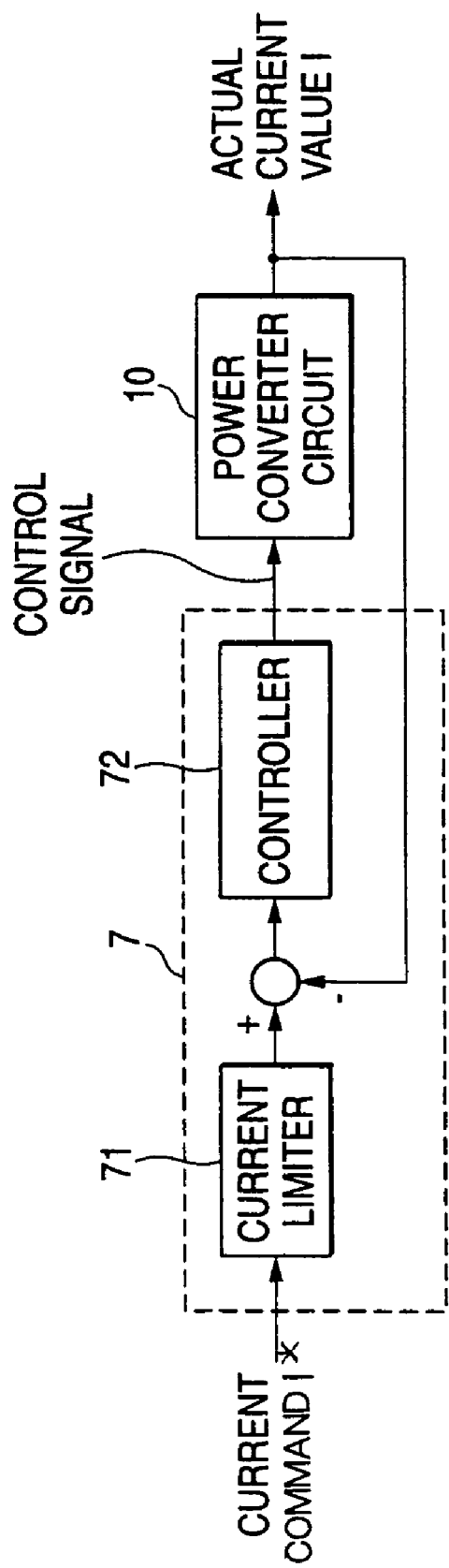
FIG. 4 is a configuration diagram of the CPU in Embodiment 2.
Figure 5:
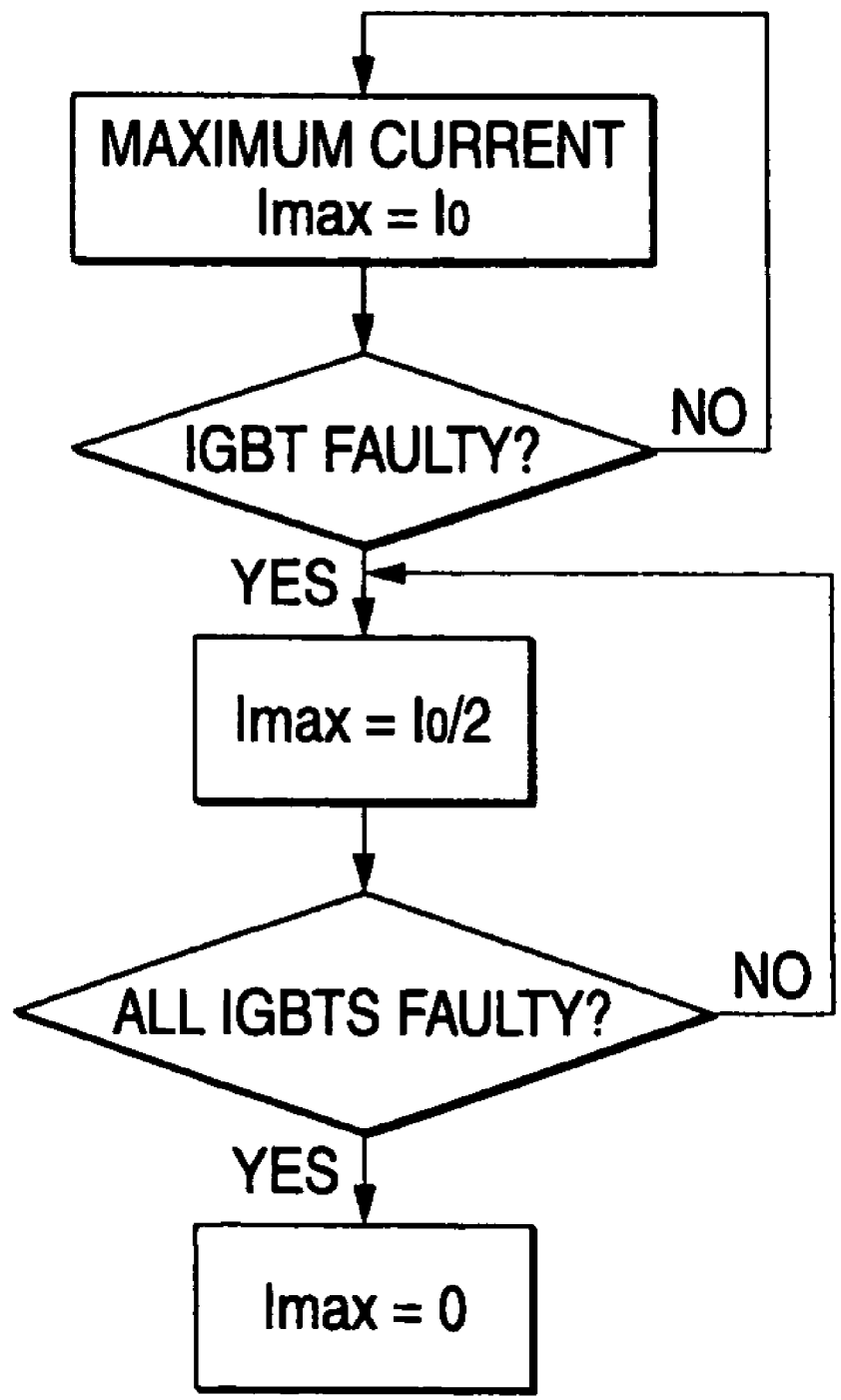
FIG. 5 is a flowchart for illustrating the current limiting function of the CPU according to Embodiment 2.

As illustrated in FIG. 4, the CPU 7 has a controller 72 for comparing an actual current value I with a current command I* and generating a control signal such that both values will become equal, and a current limiter 71 for controlling the semiconductor power conversion circuit 10 so as not to exceed the permissible current. As illustrated in FIG. 5, the maximum current Imax is $I_0$ while the IGBT is being operated properly, but when it is determined that either one of the IGBTs is faulty, the maximum current is changed into $I_1$, and a semi-failure signal is transmitted to an upper level controller. Here, the $I_1$ is set to a value equal to or less than one half of $I_0$. If it is determined that all the IGBTs are faulty, the maximum current is set to 0, the operation of the power converter circuit 10 is halted, and a failure signal is transmitted to the upper level controller.

It should be noted that although one CPU is illustrated to serve the control signal generating function and the current limiting function collectively herein, a plurality of CPUs may share the functions.

Thus, according to Embodiment 2, the semiconductor power converter apparatus is provided with the current sensor 11 for detecting the output current of the semiconductor power conversion circuit 10 in which a plurality of IGBTs connected in parallel, and a current limiting unit for limiting the output current if the detected value by the current sensor 11 is equal to or less than a desired set value when the overcurrent protection circuit 6 or the overheat protection circuit 5 operates. Thereby, failure information of an IGBT can be kept track of, and a semiconductor power converter apparatus with higher reliability and higher redundancy can be realized.

Embodiment 3

Figure 6:
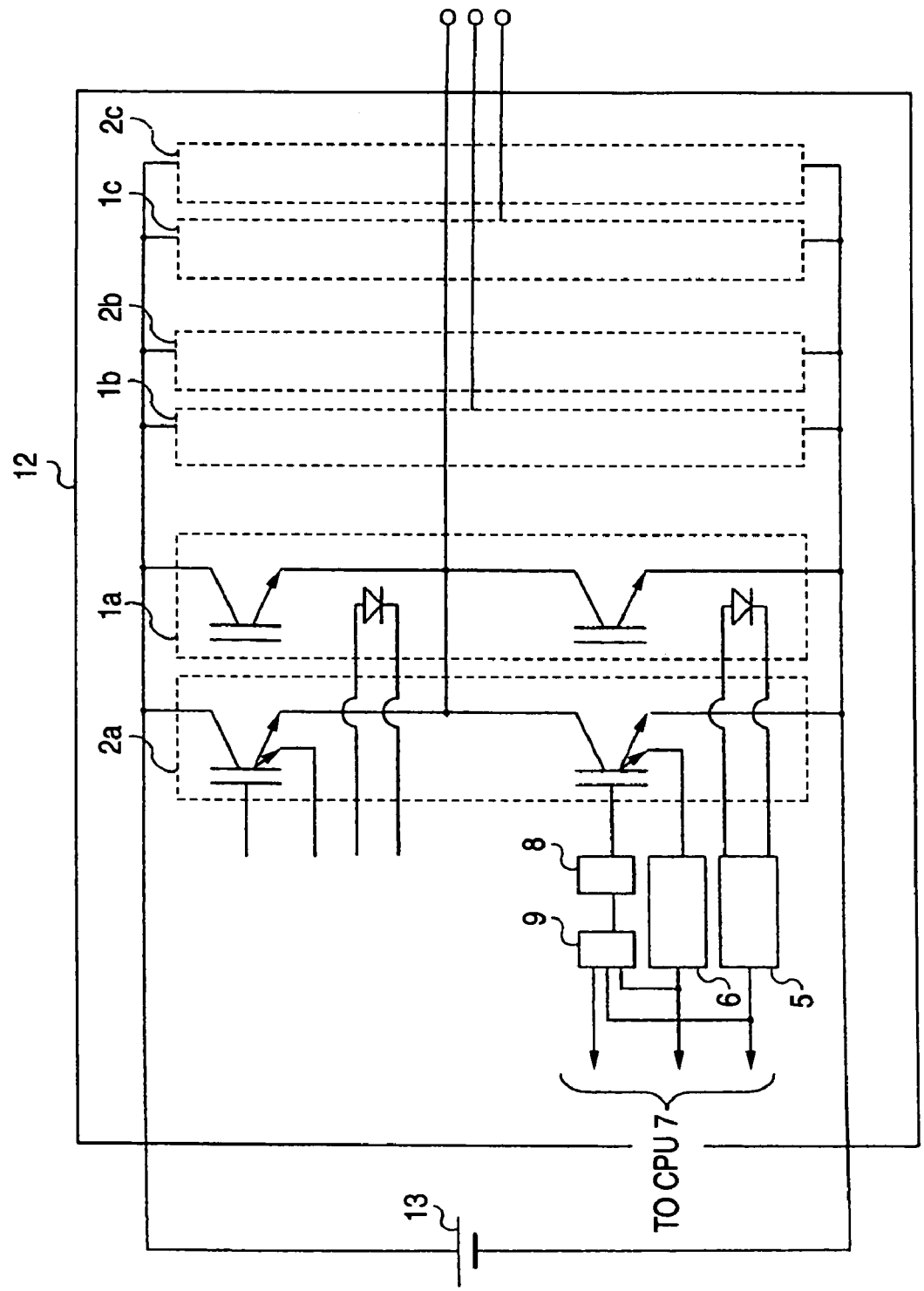
FIG. 6 is a circuit diagram of a three phase inverter device according to Embodiment 3.
Figure 7:
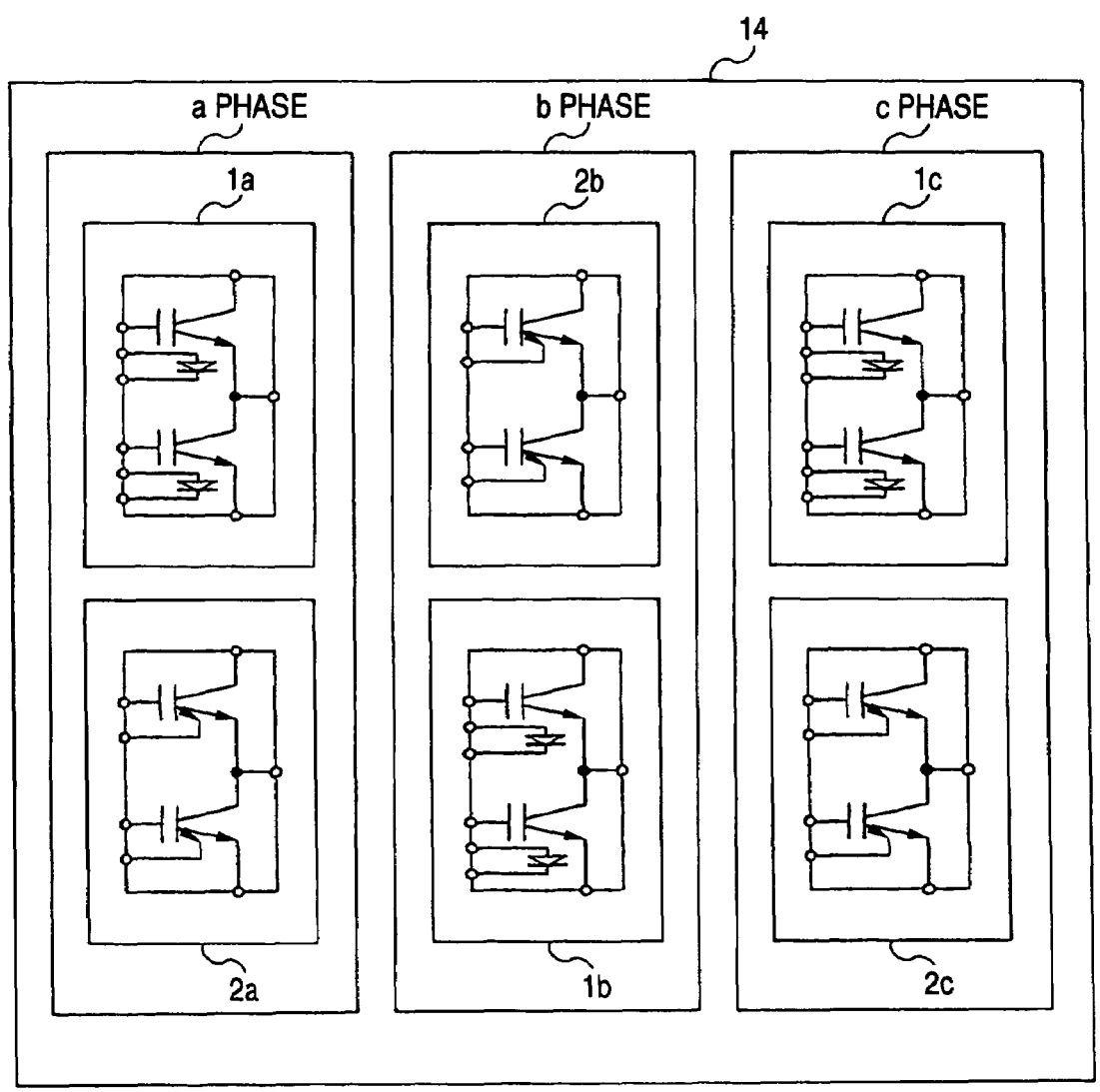
FIG. 7 is a layout diagram of IGBTs that form a bridge arm of the three phase inverter device according to Embodiment 3.

FIGS. 6 and 7 are a circuit diagram of a three phase inverter device according to Embodiment 3 of the invention and a layout diagram of IGBTs that form inverter bridges, respectively.

Referring to FIG. 6, a three phase inverter circuit 12 comprises three sets of IGBT modules 1a, 1b, and 1c each including two IGBTs each having a temperature sensing diode 3, and three sets of IGBT modules 2a, 2b, and 2c each including two IGBTs each having a current sensing cell 4, and it converts DC power supplied from a battery 13 into AC power.

Each of the bridge arms of the three phase inverter circuit 12 is formed by connecting the IGBTs of the IGBT modules 1a, 1b, and 1c with the IGBTs of the IGBT modules 2a, 2b, and 2c in parallel one by one, and each of the IGBTs connected in parallel is provided with an overheat protection circuit 5 and an overcurrent protection circuit 6, as illustrated in Embodiment 1.

Furthermore, as illustrated in FIG. 7, the IGBT modules 1a, 1b, 1c and the IGBT modules 2a, 2b, 2c are arranged in a same heatsink 14 in a checkerboard pattern so as to alternate with each other.

The main cause of overheat destruction of the IGBTs is the passage of overcurrent through the IGBTs, but when there is a variation in the cooling performance, overheat destruction of the IGBTs may also occur. For this reason, for a semiconductor power converter apparatus that does not perform temperature detection for all the IGBTs, it is important to suppress the variation in cooling performance among the IGBTs.

This embodiment makes it possible to suppress a variation in cooling performance among the IGBT modules by providing all the IGBT modules that constitute the three phase inverter circuit 12 on the same heatsink 14 and actively effecting thermal coupling between the IGBT modules.

Moreover, the IGBT modules 1a, 1b, and 1c each having the temperature sensing diode 3 and the IGBT modules 2a, 2b, and 2c each having the current sensing cell 4 are arranged in the heatsink 14 in a checkerboard pattern so as to alternate with each other, whereby the variation in cooling performance can also be suppressed.

Thus, according to this embodiment, each of the bridge arms of the three phase inverter circuit 12 is formed by connecting the IGBTs of the IGBT modules 1a, 1b, and 1c each having the temperature sensing diode 3 with those of the IGBT modules 2a, 2b, and 2c each having the current sensing cell 4 in parallel one by one, and then by arranging all the IGBT modules in the same heatsink 14 in a checkerboard pattern, a variation in cooling performance can be suppressed, and a highly reliable three phase inverter device can be realized.

What is claimed is:

1. A semiconductor power converter apparatus comprising:
   a semiconductor power conversion circuit in which a first semiconductor element having a temperature sensing unit and a second semiconductor element having a current sensing unit are connected in parallel, for causing the first and second semiconductor elements to perform switching operations;
   an overheat protection circuit for performing overheating protection for the first and second semiconductor elements based on temperature information obtained from the temperature sensing unit of the first semiconductor element;
   an overcurrent protection circuit for performing overcurrent protection for the first and second semiconductor elements based on current information obtained from the current sensing unit of the second semiconductor element;
   a current sensor for sensing an output current of the semiconductor power conversion circuit, and
   means for determining that one of the first and second semiconductor elements fails to limit the output current of the semiconductor power conversion circuit if a detected value of the current sensor is equal to or lower than a predetermined set value, during operation of the overcurrent protection circuit or the overheat protection circuit.

2. The semiconductor power converter apparatus according to claim 1, wherein a current value at which the overcurrent protection circuit operates is set to be equal to or lower than a current value at which the overheat protection circuit operates.

3. The semiconductor power converter apparatus according to claim 1, wherein the first and second semiconductor elements are mounted on a same heatsink.

4. The semiconductor power converter apparatus according to claim 1, wherein a plurality of the first and second semiconductor elements are arranged on a same heatsink in a checkerboard pattern so as to form a three phase inverter device.

5. The semiconductor power converter apparatus according to claim 1, wherein the first and second semiconductor elements are IGBTs.

* * * * *